US010068856B2

(12) United States Patent
Kao et al.

(10) Patent No.: US 10,068,856 B2
(45) Date of Patent: Sep. 4, 2018

(54) INTEGRATED CIRCUIT APPARATUS

(71) Applicant: MEDIATEK INC., Hsin-Chu (TW)

(72) Inventors: Jui-Chih Kao, New Taipei (TW);
Ming-Da Tsai, Miaoli County (TW);
Yuan-Yu Fu, Hsinchu County (TW);
Chih-Chun Hsu, New Taipei (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/609,039

(22) Filed: May 31, 2017

(65) Prior Publication Data
US 2018/0019210 A1 Jan. 18, 2018

Related U.S. Application Data

(60) Provisional application No. 62/360,982, filed on Jul. 12, 2016.

(51) Int. Cl.
*H01L 23/552* (2006.01)
*H01L 23/58* (2006.01)
*H01L 23/64* (2006.01)

(52) U.S. Cl.
CPC ......... *H01L 23/552* (2013.01); *H01L 23/585* (2013.01); *H01L 23/645* (2013.01)

(58) Field of Classification Search
CPC .................... H01L 23/552; H01L 23/5227
See application file for complete search history.

(56) References Cited

U.S. PATENT DOCUMENTS

| 6,777,774 | B2 | 8/2004 | Beng |
| 7,141,883 | B2 | 11/2006 | Wei |
| 7,629,930 | B2 | 12/2009 | Murch |
| 2009/0308653 | A1* | 12/2009 | Wu ........................ H01Q 1/526 174/377 |
| 2010/0109133 | A1* | 5/2010 | Ito ....................... H01L 25/0657 257/660 |
| 2013/0147023 | A1 | 6/2013 | Lin |
| 2013/0256848 | A1* | 10/2013 | Kawabata ............... H01L 23/60 257/659 |

FOREIGN PATENT DOCUMENTS

| TW | 200926355 | 6/2009 |
| TW | 201428900 A | 7/2014 |

* cited by examiner

*Primary Examiner* — Thomas L Dickey
(74) *Attorney, Agent, or Firm* — Winston Hsu

(57) ABSTRACT

An integrated circuit apparatus includes a substrate, an IC chip disposed above the substrate, and an electromagnetic shielding layer disposed on a surface of the substrate. The IC chip includes an electromagnetic coupling device. The electromagnetic shielding layer and the electromagnetic coupling device partially overlap in a vertical projection direction of the surface of the substrate.

44 Claims, 8 Drawing Sheets

INTEGRATED CIRCUIT APPARATUS

CROSS REFERENCE TO RELATED APPLICATIONS

This application claims the benefit of U.S. provisional application No. 62/360,982, filed Jul. 12, 2016, and the entirety of which is incorporated by reference herein.

BACKGROUND

The present invention relates to an integrated circuit apparatus, and more particularly, to an integrated circuit apparatus which has an improved electric performance of its electromagnetic device.

As techniques of the semiconductor fabrication grow, both the size of the electric devices and the spacing between the adjacent electric devices disposed on the integrated circuit (IC) chip become smaller in order to decrease the cost and improve the integration degree. However, when the spacing between adjacent electromagnetic coupling devices, such as inductors, is too small, the interference of mutual magnetic coupling between the inductors will become serious, which results in performance degradation and influence on signal transmission paths. Generally, the closer the adjacent inductors are, the more significant the interference of the mutual electromagnetic coupling is. Especially, when the electromagnetic coupling devices are applied to carrier aggregation techniques, the isolation between each operating path in transceiver is very important for avoiding the interferences of unexpected spurs form mutual electromagnetic coupling. Furthermore, performance degradation also affects the power consumption. Accordingly, it is an important challenge to improve the isolation between the electromagnetic coupling devices without increasing the size of the IC chip.

SUMMARY

One of the objectives of the present invention is to provide an integrated circuit apparatus thereof including a specific design of electromagnetic shielding pattern for improving the isolation of electromagnetic coupling.

To achieve the above objective, one of the embodiments of the present invention provides an integrated circuit apparatus that includes a substrate, an IC chip disposed above the substrate, and an electromagnetic shielding layer disposed on a surface of the substrate. The IC chip includes an electromagnetic coupling device. The electromagnetic shielding layer and the electromagnetic coupling device partially overlap in a vertical projection direction of the surface of the substrate.

According to the aforementioned technique, the integrated circuit apparatus of the present invention utilizes the specific pattern design of the electromagnetic shielding layer for providing isolation of the electromagnetic coupling device to improve coupling issue. Specifically, the electromagnetic shielding layer only partially overlaps the electromagnetic coupling device, such that the performance degradation of the electromagnetic coupling device is not serious for that less parasitic capacitances is generated. Accordingly, a balance performance between the isolation and the properties of the electromagnetic coupling device is obtained. In other words, the electromagnetic shielding layer is capable of improving the isolation of the electromagnetic coupling device with less performance degradation or less affecting the properties of the electromagnetic coupling device These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following descriptions and claims to refer to particular system components. As one skilled in the art will appreciate, manufacturers may refer to a component by different names. This document does not intend to distinguish between components that differ in name but not differ in functionality. In the following discussion and in the claims, the terms "include", "including", "comprise", and "comprising" are used in an open-ended fashion, and thus should be interpreted to mean "including, but not limited to . . . " The terms "couple" and "coupled" are intended to mean either an indirect or a direct electrical connection. Thus, if a first device couples to a second device, that connection may be through a direct electrical connection, or through an indirect electrical connection via other devices and connections.

To provide a better understanding of the present invention to the skilled users in the technology of the present invention, preferred embodiments will be detailed as follows. The preferred embodiments of the present invention are illustrated in the accompanying drawings with numbered elements to elaborate the contents and effects to be achieved.

Figure 1:
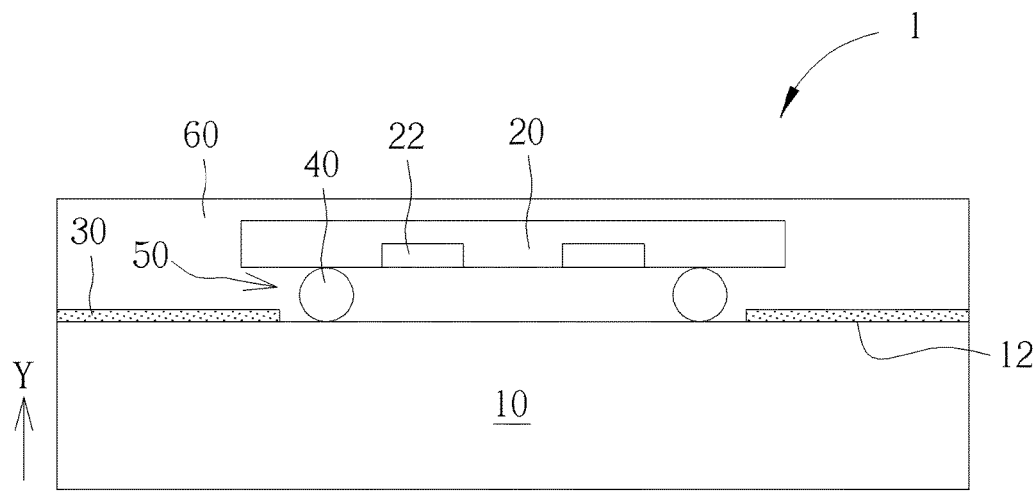
FIG. 1 is a schematic diagram of a cross-sectional view of an integrated circuit apparatus according to one embodiment of the present invention.

Referring to FIG. 1, FIG. 1 is a schematic diagram of a cross-sectional view of an integrated circuit apparatus according to one embodiment of the present invention. As shown in FIG. 1, an integrated circuit apparatus 1 of the present invention includes a substrate 10, an IC chip 20 and a conductive layer 30. The substrate 10 may be a printed circuit board (PCB), a carrier of a package, a package, a ceramic substrate, a plastic substrate or other suitable dielectric substrate that can be utilized for supporting electric device(s) or chip(s). The IC chip 20 is disposed above the substrate 10, and includes at least one electromagnetic coupling device 22, wherein only one electromagnetic coupling device 22 is illustrated in FIG. 1 as an example. The IC chip 20 may be a die fabricated through a semiconductor fabrication process, but not limited thereto. The electromagnetic coupling device 22 can receive signals, transmit signals or be electromagnetically coupled to other device. In FIG. 1, the electromagnetic coupling device 22 is an inductor for instance, but not limited thereto. In some embodiments, the electromagnetic coupling device 22 may comprise a coil. The conductive layer 30 is disposed on a surface 12 of the substrate 10, and disposed between the substrate 10 and the IC chip 20. The material of the conductive layer 30 may include one of copper, nickel, palladium, gold and a combination thereof. In addition, the integrated circuit apparatus 1 may selectively further include a plurality of bumps 40 disposed between the substrate 10 and the IC chip 20 for electrically connecting the electric device(s) of the IC chip 20 to the conductive line(s) or other electric device(s) on the substrate 10. Thus, a gap 50 would be generated between the substrate 10 and the IC chip 20, that is to say, situated between the conductive layer 30 and the electromagnetic coupling device 22. In addition, the integrated circuit apparatus 1 may further comprise a molding material 60 disposed above the substrate 10 for packaging the elements or devices of the integrated circuit apparatus 1. The molding material 60 may include, but not limited to, epoxy material or conductive adhesion. The molding material 60 covers the IC chip 20 and the conductive layer 30 and fills the gap 50. In other words, the integrated circuit apparatus 1 includes an underfill (the molding material 60) in the gap 50 between the conductive layer 30 and the electromagnetic coupling device 22. In some embodiments, the molding material 60 may not cover the top surface of the chip 20.

Figure 2:
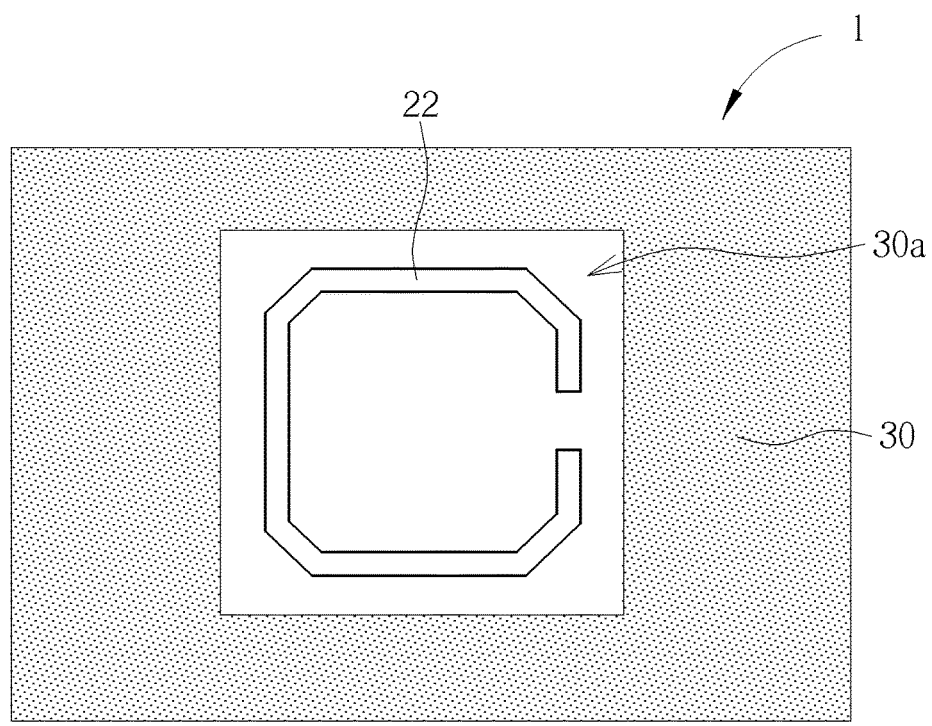
FIG. 2 is a schematic diagram of a top view of the conductive layer and the electromagnetic coupling device according to a first embodiment of the present invention.

Referring to FIG. 2, FIG. 2 is a schematic diagram of a top view of the conductive layer and the electromagnetic coupling device according to a first embodiment of the present invention. In order to clearly emphasize the main sprit of the present invention, only the patterns of the conductive layer 30 and the electromagnetic coupling device 22 are illustrated in FIG. 2, as well as FIGS. 3-4, FIGS. 6-8 and FIG. 11. In this embodiment, the electromagnetic coupling device 22 is an inductor for example in FIG. 2, which has a top view of C-shaped pattern, but not limited thereto. As shown in FIG. 2, the conductive layer 30 of the integrated circuit apparatus 1 of this embodiment may serve as a grounding layer that is grounded. In addition, the conductive layer 30 of the integrated circuit apparatus 1 of this embodiment has a hollow 30a and surrounds the electromagnetic coupling device 22. That is to say, the conductive layer 30 does not overlap the electromagnetic coupling device 22 in a vertical projection direction Y of the surface 12 of the substrate 10 (shown in FIG. 1). Because of the disposition of the hollow 30a of the conductive layer 30, a good inductor performance of the inductor, the electromagnetic coupling device 22, can be obtained. In other words, the quality factor (Q) of the electromagnetic coupling device 22 is increased. However, since no conductive material layer is positioned right below the electromagnetic coupling device 22, the conductive layer 30 cannot provide isolation function to the electromagnetic coupling device 22, resulted in a strong magnetic coupling of the electromagnetic coupling device 22.

Figure 3:
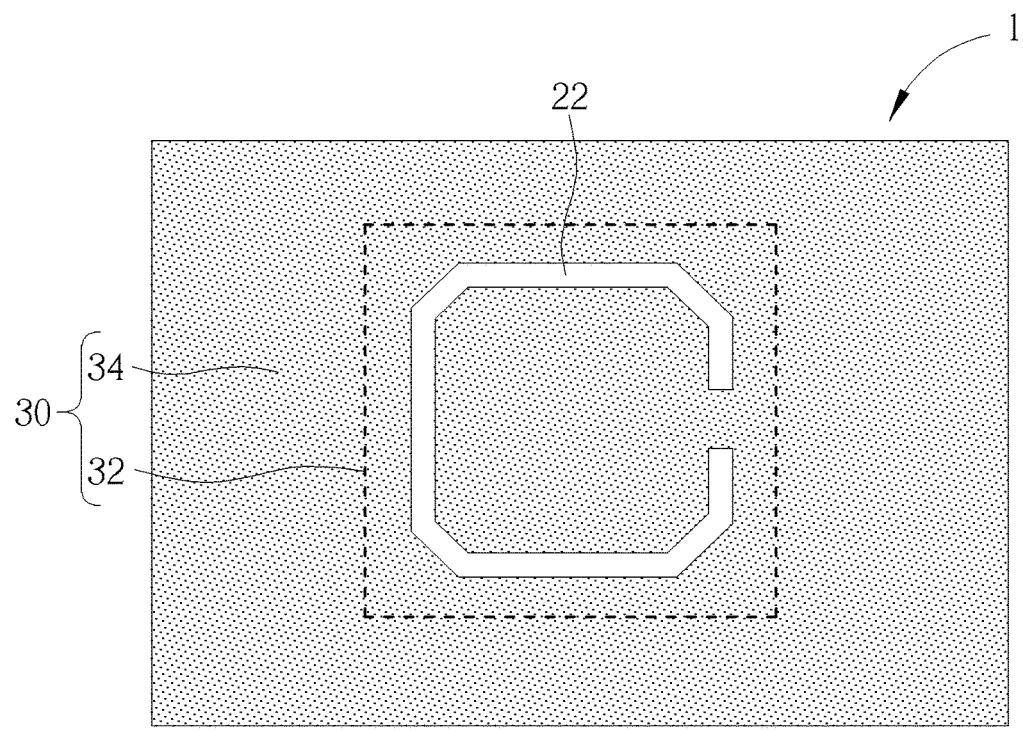
FIG. 3 is a schematic diagram of a top view of the conductive layer and the electromagnetic coupling device according to a second embodiment of the present invention.

Referring to FIG. 3, FIG. 3 is a schematic diagram of a top view diagram of the conductive layer and the electromagnetic coupling device according to a second embodiment of the present invention, wherein the electromagnetic coupling device 22 is an inductor for example in FIG. 3. As shown in FIG. 3, the conductive layer 30 of the integrated circuit apparatus 1 of this embodiment includes an electromagnetic shielding layer 32 and a grounding layer 34. The electromagnetic shielding layer 32 is solid, thus the electromagnetic coupling device 22 is completely overlapped with the electromagnetic shielding layer 32 in a vertical projection direction Y of the surface 12 of the substrate 10. In addition, the electromagnetic shielding layer 32 is surrounded by the grounding layer 34, wherein the grounding layer 34 is grounded and connected to the edge of the electromagnetic shielding layer 32. Therefore, the conductive layer 30 including the electromagnetic shielding layer 32 and the grounding layer 34 may be a full-surface layer, and the electromagnetic shielding layer 32 is grounded.

In this embodiment, because of the complete overlap of the electromagnetic shielding layer 32 and the electromagnetic coupling device 22, eddy current would be induced on the electromagnetic shielding layer 32 when the electromagnetic coupling device 22 is in operation. Thus, compared with the first embodiment, the electromagnetic coupling of the electromagnetic coupling device 22 of this embodiment would be decreased by the eddy current, such that the isolation of the electromagnetic coupling device 22 can be improved. In this embodiment, because the conductive layer 30 of the integrated circuit apparatus 1 includes the electromagnetic shielding layer 32, the gain of unwanted signal is smaller than the gain of the first embodiment. However, the inductor performance of the electromagnetic coupling device 22 is degraded accordingly. In addition, the disposition of the solid electromagnetic shielding layer 32 generates the parasitic capacitor between the solid electromagnetic shielding layer 32 and the electromagnetic coupling device 22, which may increase the electric coupling path and also degrade the inductors performance. Furthermore, the parasitic capacitance is determined by the distance between the electromagnetic shielding layer 32 and the electromagnetic coupling device 22. Therefore, the size of the bumps 40 or the height of the gap 50 also influence on the performance of the electromagnetic coupling device 22. Thus, compared with the first embodiment, the inductance of the electromagnetic coupling device 22 is decreased approximately 3.6%, and the quality factor of the electromagnetic coupling device 22 is decreased approximately 1%.

Figure 4:
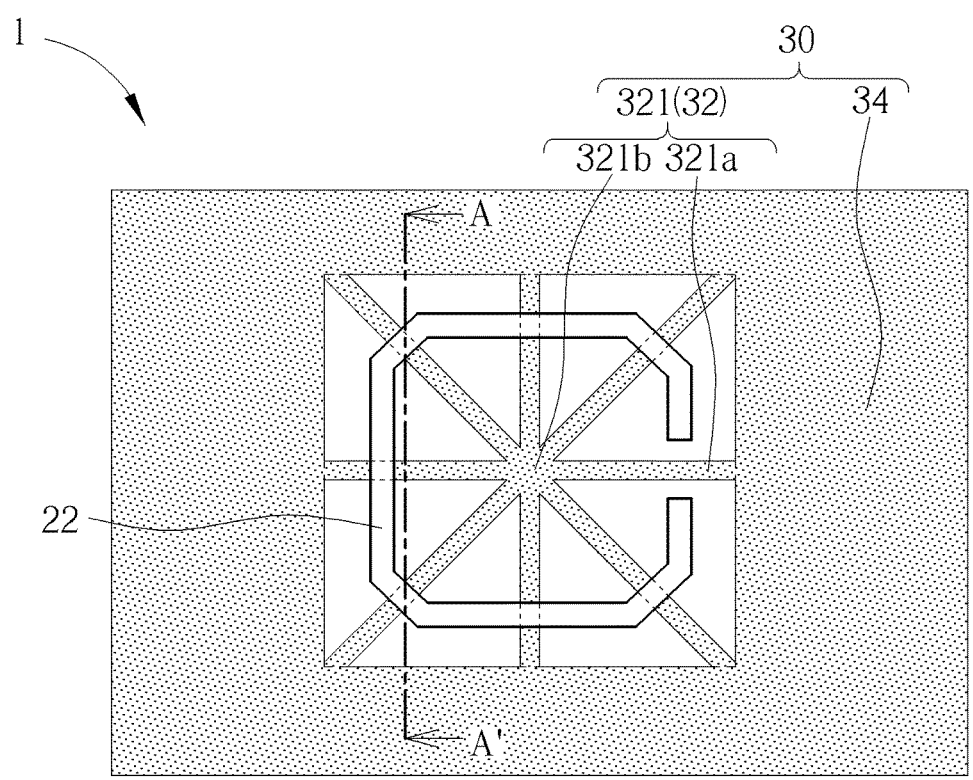
FIG. 4 is a schematic diagram of a top view of the conductive layer and the electromagnetic coupling device according to a third embodiment of the present invention.
Figure 5:
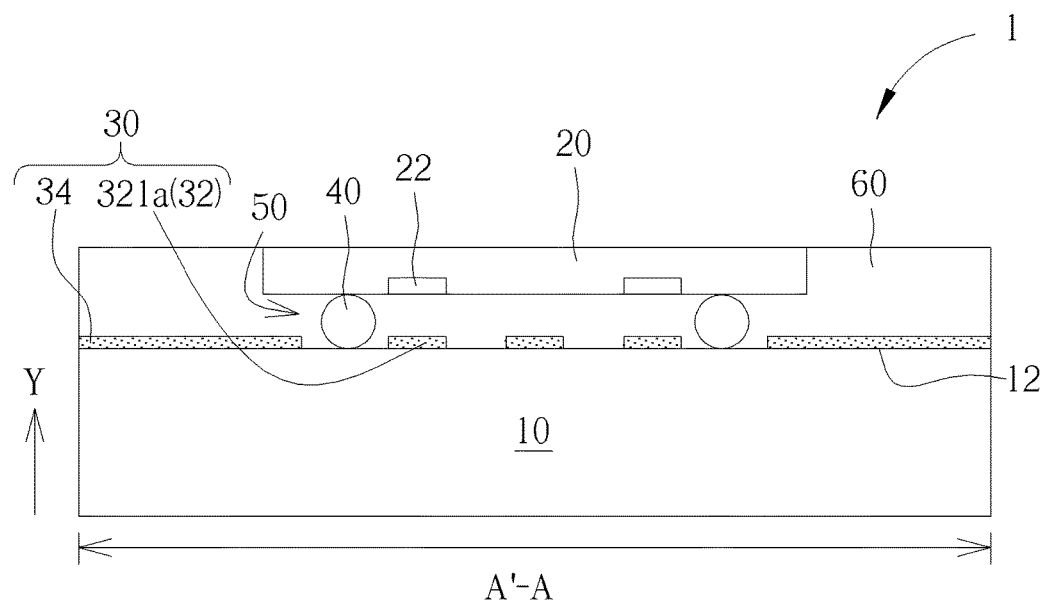
FIG. 5 is a schematic diagram of a cross-sectional view taken along the cross-sectional line A-A' of the integrated circuit apparatus in FIG. 4.

Referring to FIG. 4 and FIG. 5, FIG. 4 is a schematic diagram of a top view of the conductive layer and the electromagnetic coupling device according to a third embodiment of the present invention, and FIG. 5 is a schematic diagram of a cross-sectional view taken along the cross-sectional line A-A' of the integrated circuit apparatus in FIG. 4, wherein the electromagnetic coupling device 22 is an inductor for example in FIG. 4 and FIG. 5. As shown in FIG. 4 and FIG. 5, the conductive layer 30 of the integrated circuit apparatus 1 of this embodiment include an electromagnetic shielding layer 32 and a grounding layer 34, which means the grounding layer 34 and the electromagnetic shielding layer 32 belong to the same patterned layer. The electromagnetic shielding layer 32 is corresponding to the electromagnetic coupling device 22 and has a specific pattern design such that it partially overlaps the electromagnetic coupling device 22 in a vertical projection direction Y of the surface 12 of the substrate 10 (shown in FIG. 5), while the grounding layer 34 is grounded and surrounds the electromagnetic shielding layer 32, as mentioned in the previous embodiment. Specifically, the electromagnetic shielding layer 32 include a symmetric pattern 321, and the symmetric pattern 321 may be a radial pattern such as a star-shaped pattern, a snowflake-shaped pattern or other suitable pattern, but not limited thereto. For example, in FIG. 4, the pattern of the electromagnetic shielding layer 32 is a star-shaped pattern. However, in a variant embodiment, the pattern of the electromagnetic shielding layer 32 may be a non-symmetric star-shaped pattern. The symmetric pattern 321 in FIG. 4 may include a plurality of branches 321a extends from the center 321b of the symmetric pattern 321 outward to the edge of the electromagnetic shielding layer 32, wherein the center 321b may be a symmetric center of the symmetric pattern 321 in this embodiment. Further, at least one of the branches 321a is connected to the grounding layer 34 that surrounds the electromagnetic shielding layer 32. In FIG. 4, all of the branches 321a are connected to the grounding layer 34 as an example, and that is to say, the electromagnetic shielding layer 32 is grounded, but not limited thereto. In addition, since the pattern of the electromagnetic shielding layer 32 is connected to the grounding layer 34, an enclosing loop would be formed with the symmetric pattern 321 and the grounding layer 34. Therefore, it could be considered as that the electromagnetic shielding layer 32 and the grounding layer 34 connected with the electromagnetic shielding layer 32 forms a closed-loop pattern. In addition, the center 321b of the symmetric pattern 321 (or the electromagnetic shielding layer 32) may be substantially corresponding to the center of the electromagnetic coupling device 22, but it is not an essential requirement. The package deviation and inaccuracy is acceptable, and the shift of the center 321b does not influence the isolation performance of the electromagnetic coupling device 22 evidently. It should be noted that the grounding layer 34 is not an essential element of the present invention. Accordingly, in a variant embodiment, the grounding layer 34 can be omitted or that the electromagnetic shielding layer 32 may not be connected to the grounding layer 34, and thus the electromagnetic shielding layer 32 is floating.

Since the electromagnetic shielding layer 32 and the electromagnetic coupling device 22 partially overlap along the vertically projection direction Y of the surface 12 of the substrate 10, the eddy current would be generated on the electromagnetic shielding layer 32 when the electromagnetic coupling device 22 is in operation. In addition, the closed-loop pattern formed by the electromagnetic shielding layer 32 and the grounding layer 34 also promotes the generation of the eddy current, such that the isolation of the electromagnetic coupling device 22 can be improved by the eddy current which decreases the electromagnetic coupling. In addition, compared with the second embodiment, the electromagnetic shielding layer 32 of this embodiment has a specific star-shaped pattern and only partially overlaps the electromagnetic coupling device 22, thus the generation path of eddy current would be tortuous such that less eddy current is generated on the electromagnetic shielding layer 32. In addition, because of the pattern design of the electromagnetic shielding layers 32, the influence of the fabrication variation, such as the size of bumps 40 or the height of the gap 50, on the performance of the electromagnetic coupling device 22 would be decreased. Therefore, according to the design of the electromagnetic shielding layer 32, although the effect of the isolation of the electromagnetic coupling device 22 of this embodiment may be less than the second embodiment, the degradation of properties (such as the inductor performance and the quality factor) of the electromagnetic coupling device 22 is less. That is to say, the isolation of the electromagnetic coupling device 22 of this embodiment is effective while the degradation of the properties of the electromagnetic coupling device 22 is not significant. On the other hand, the overlap area of the electromagnetic shielding layer 32 and the electromagnetic coupling device 22 is smaller than that of the second embodiment, so the parasitic capacitance is less. Therefore, electrical coupling path between the electromagnetic shielding layer 32 and the electromagnetic coupling device 22 is decreased. According to this embodiment, because of the specific pattern design of the electromagnetic shielding layer 32 with only partially overlapping the electromagnetic coupling device 22, the gain of unwanted signal is smaller than the gain of the first embodiment. Compared with the first embodiment, the inductance of the electromagnetic coupling device 22 of this embodiment is only decreased approximately 0.5% to 1.4%, and the quality factor of the electromagnetic coupling device 22 is only decreased approximately 0.8%, which is better than the second embodiment. As a result, this embodiment provides a balance performance between the isolation and the properties of the electromagnetic coupling device 22. Furthermore, the shielding structure, the electromagnetic shielding layer 32, is not disposed in the IC chip 20, and therefore this embodiment maintains the layout and size of the IC chip 20 while providing the good isolation and inductor performance at the same time without raising fabrication cost.

In addition, the integrated circuit apparatus 1 may selectively further comprise a molding material 60 disposed above the substrate 10. Therefore, the integrated circuit apparatus 1 includes an underfill (the molding material 60) in the gap 50 between the electromagnetic shielding layer 32 and the electromagnetic coupling device 22. In this embodiment, the molding material 60 does not cover the top surface of the chip 20.

In another embodiment, the IC chip 20 further includes a plurality of electromagnetic coupling devices 22, and the integrated circuit apparatus 1 further includes a plurality of electromagnetic shielding layers 32, wherein each electromagnetic shielding layer 32 is corresponding to one electromagnetic coupling device 22 and partially overlaps the corresponding electromagnetic coupling device 22. Owing to the partial overlap of each electromagnetic shielding layer 32 and the corresponding electromagnetic coupling device 22, the mutual electromagnetic coupling between the electromagnetic coupling devices 22 is decreased while the properties of the electromagnetic coupling devices 22 are not affected significantly. Therefore, the interference between the electromagnetic coupling devices 22 can be improved.

The integrated circuit apparatus of this invention are not limited to the above embodiments. Further embodiments of the integrated circuit apparatus are described below. To compare each embodiment conveniently and simplify the description, each embodiment has the same device labeled with the same symbol. The description just descripts the differences between each embodiment, and repeated parts will not be redundantly described.

Figure 6:
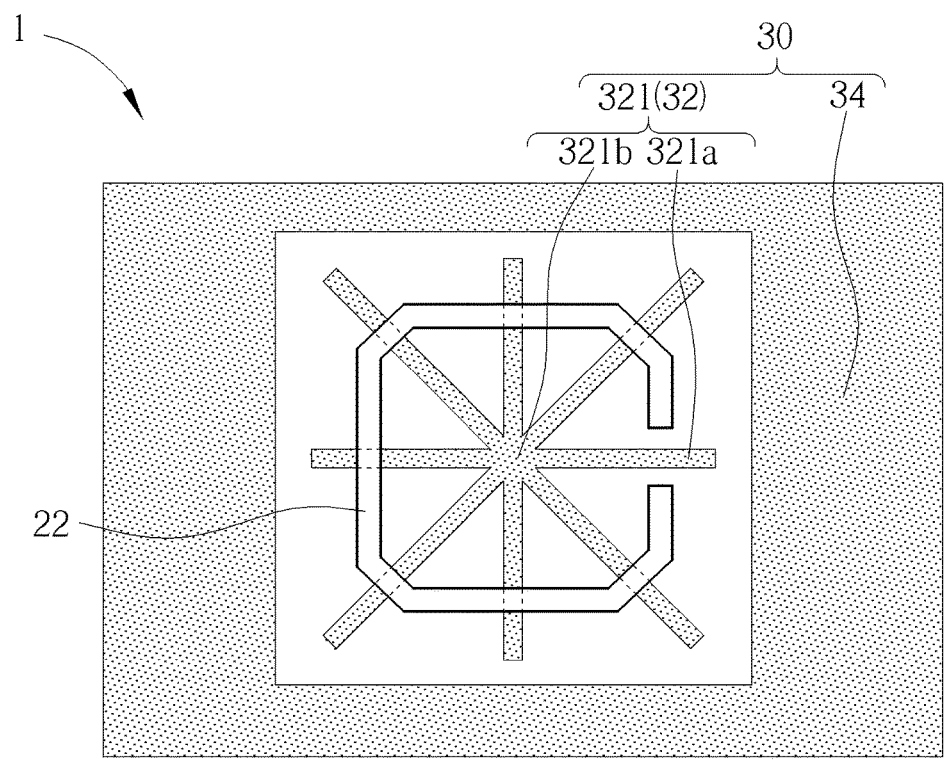
FIG. 6 is a schematic diagram of a top view of the conductive layer and the electromagnetic coupling device according to a fourth embodiment of the present invention.

Referring to FIG. 6, FIG. 6 is a schematic diagram of a top view diagram of the conductive layer and the electromagnetic coupling device according to a fourth embodiment of the present invention, wherein the electromagnetic coupling device 22 is an inductor for example. The difference between this embodiment and the third embodiment is that all of the branches 321a of the electromagnetic shielding layer 32 in FIG. 6 are not connected to the grounding layer 34. That is to say, the electromagnetic shielding layer 32 is floating, and the symmetric pattern 321 of the electromagnetic shielding layer 32 forms an opened-loop pattern. In a variant embodiment, one of the branches 321a of the electromagnetic shielding layer 32 is longer than the other branches 321a and extends outward to contact the grounding layer 34, so as to form an opened-loop pattern by the electromagnetic shielding layer 32 and the grounding layer 34.

Figure 7:
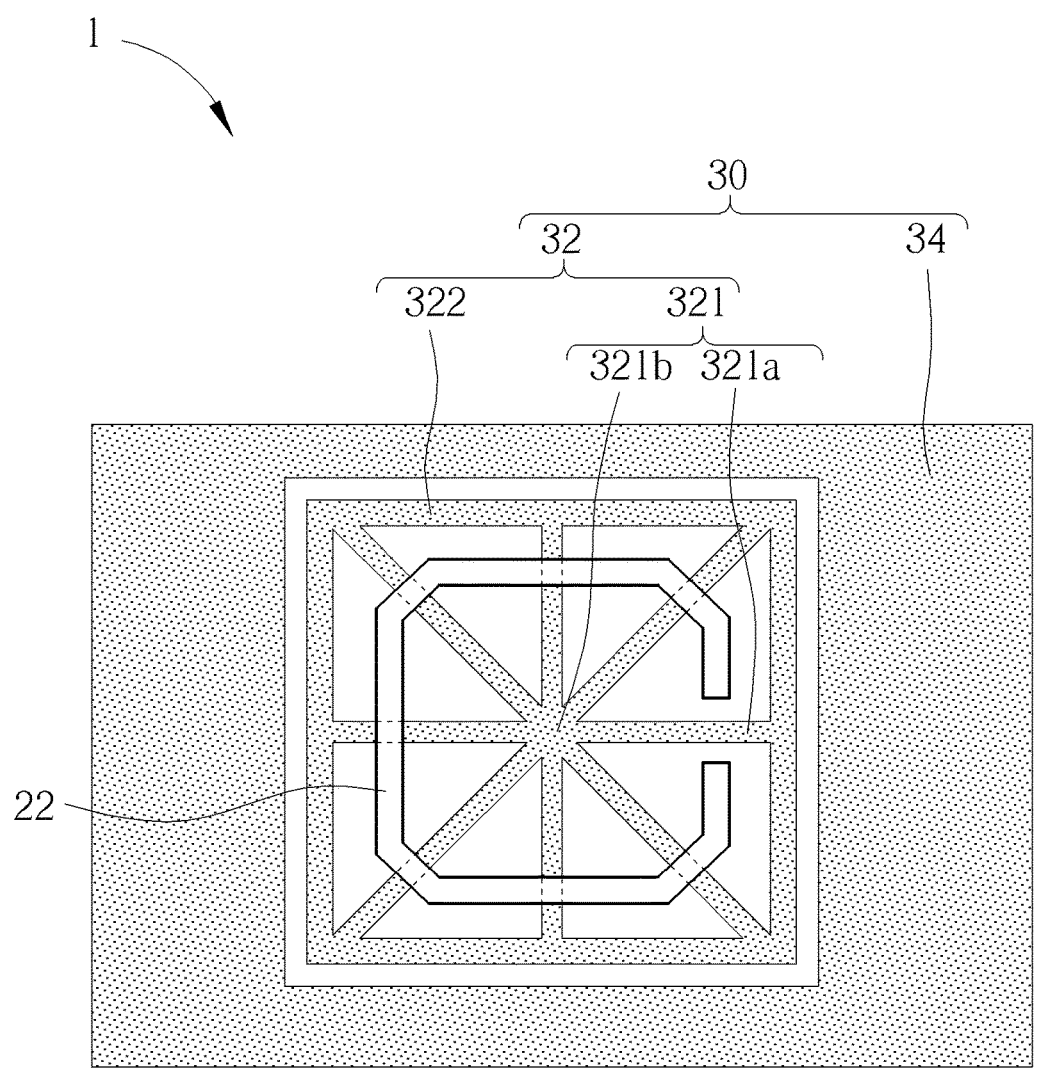
FIG. 7 is a schematic diagram of a top view of the conductive layer and the electromagnetic coupling device according to a fifth embodiment of the present invention.

Referring to FIG. 7, FIG. 7 is a schematic diagram of a top view of the conductive layer and the electromagnetic coupling device according to a fifth embodiment of the present invention, wherein the electromagnetic coupling device 22 is an inductor for example in FIG. 7. As shown in FIG. 7, the difference between this embodiment and the fourth embodiment is that the electromagnetic shielding layer 32 further includes a frame pattern 322 circling the symmetric pattern 321, and the frame pattern 322 and the symmetric pattern 321 are connected to each other. In detail, the frame pattern 322 and the symmetric pattern 321 are connected to each other through at least one of the branches 321a of the symmetric pattern 321. For example, all of the branches 321a are connected to the frame pattern 322 in FIG. 6. In this embodiment, the electromagnetic shielding layer 32 is floating and is not in contact with the grounding layer 34, but not limited thereto. As a result, the frame pattern 322 and the symmetric pattern 321 form a closed-loop pattern. In a variant embodiment, the frame pattern 322 may be directly connected to the grounding layer 34 or connected to the grounding layer 34 by other branch.

Figure 8:
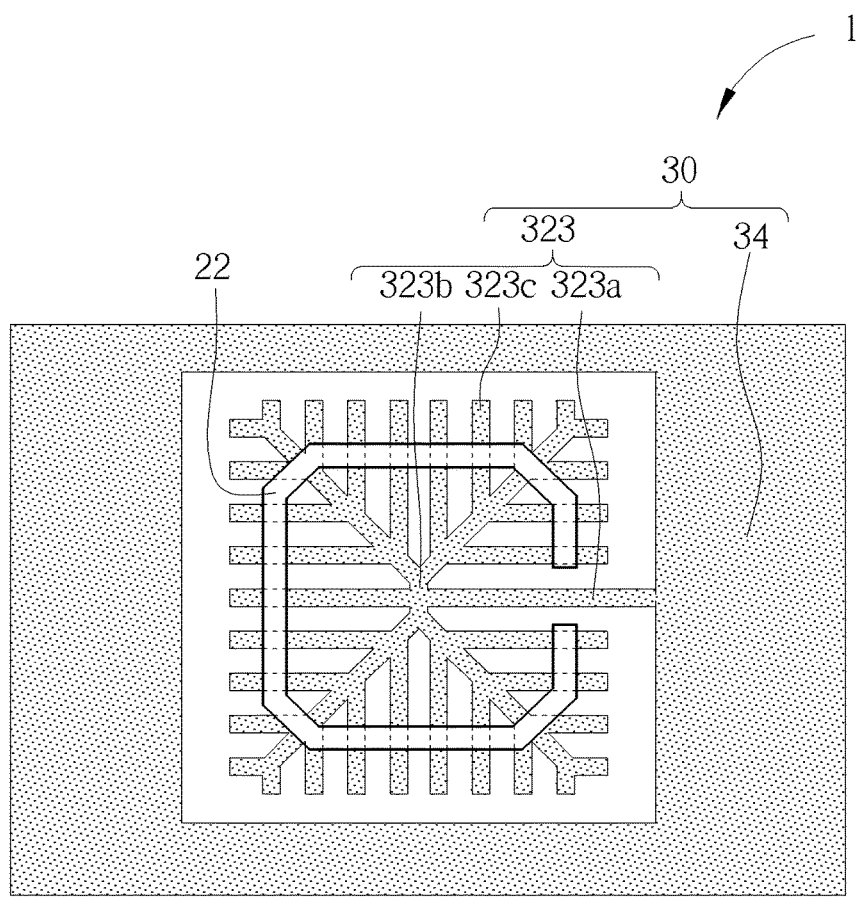
FIG. 8 is a schematic diagram of a top view of the conductive layer and the electromagnetic coupling device according to a sixth embodiment of the present invention.

Referring to FIG. 8, FIG. 8 is a schematic diagram of a top view of the conductive layer and the electromagnetic coupling device according to a sixth embodiment of the present invention, wherein the electromagnetic coupling device 22 is an inductor for example in FIG. 8. The difference between this embodiment and the third embodiment is that the pattern of the electromagnetic shielding layer 32 in FIG. 8 includes a snowflake-shaped pattern 323, not a star-shaped pattern. The snowflake-shaped pattern 323 may be similar to an on-chip patterned ground shielding (PGS) pattern, which may be a symmetric pattern or a non-symmetric pattern. The snowflake-shaped pattern 323 in FIG. 8 includes a plurality of branches 323a extending from a center 323b toward the grounding layer 34 and further includes a plurality of sub-branches 323c connected to the branches 323a. In FIG. 8, only one branch 323a is directly connected to the grounding layer 34 as an example, but not limited thereto. Accordingly, the snowflake-shaped pattern 323 and the grounding layer 34 forms an opened-loop pattern. In addition, since one of the branches 323a is connected to the grounding layer 34, the electromagnetic shielding layer 32 is grounded, but not limited thereto. In a further variant embodiment, other kinds of snowflake-shaped pattern or other types of on-chip PGS pattern may be adopted as the snowflake-shaped pattern 323. This embodiment may have other variant embodiments as mentioned in FIG. 6 and FIG. 7. For example, no branch 323a of the snowflake-shaped pattern 323 is connected to the grounding layer 34 and the snowflake-shaped pattern 323 has an opened-loop pattern in one variant embodiment, and the electromagnetic shielding layer 32 may further include a frame pattern enclosing the snowflake-shaped pattern 323 in another variant embodiment.

Figure 9:
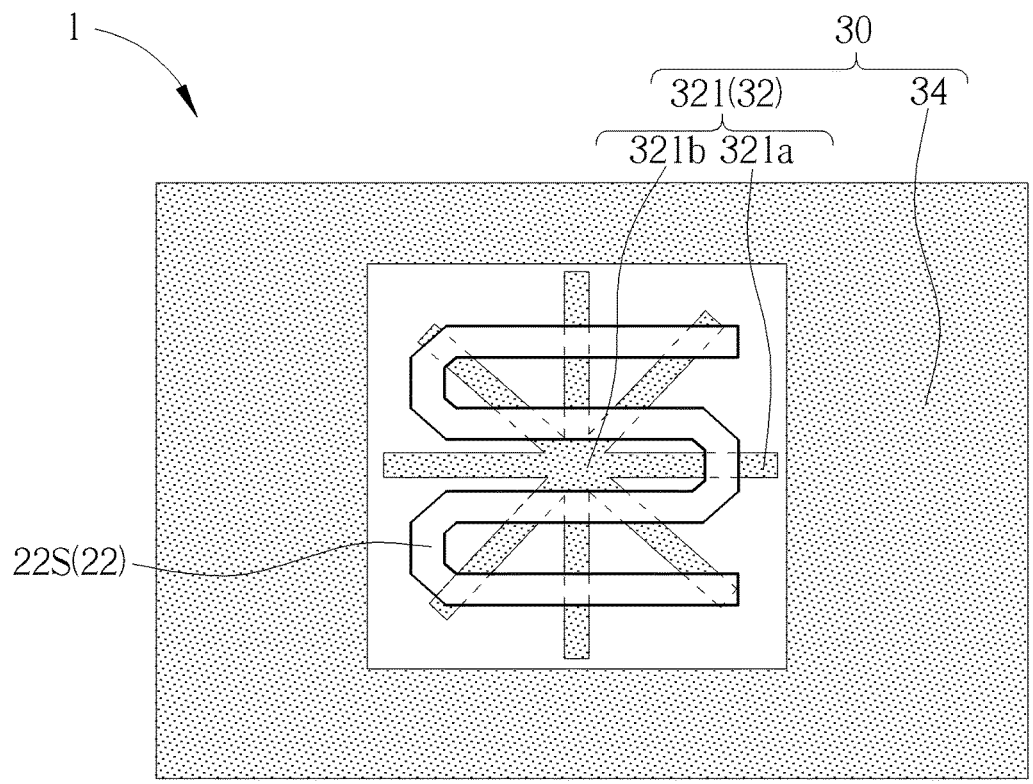
FIG. 9 is a schematic diagram of a top view of the conductive layer and a partial of the electromagnetic coupling device according to a seventh embodiment of the present invention.
Figure 10:
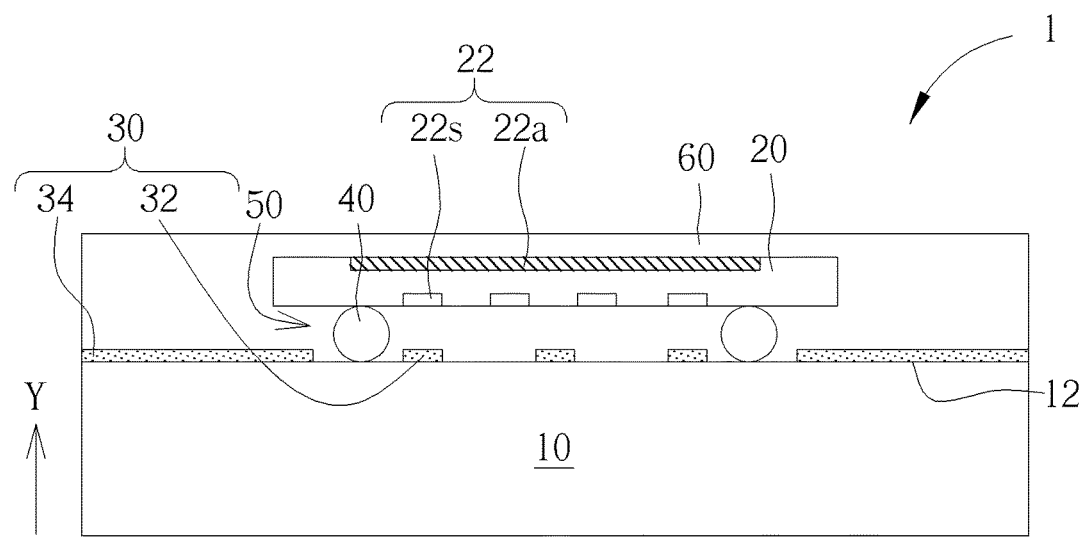
FIG. 10 is a schematic diagram of a cross-sectional view of the integrated circuit apparatus in FIG. 9.

Referring to FIG. 9 and FIG. 10, FIG. 9 is a schematic diagram of a top view of the conductive layer and a partial of the electromagnetic coupling device according to a seventh embodiment of the present invention, and FIG. 10 is a schematic diagram of a cross-sectional view of the integrated circuit apparatus in FIG. 9, wherein the electromagnetic coupling device 22 includes a transmission line for example in FIG. 9 and FIG. 10. The difference between this embodiment and the fourth embodiment is that the electromagnetic coupling device 22 includes a microstrip line which is a type of the transmission line, not an inductor. In this embodiment, the electromagnetic coupling device 22 includes a first grounding electrode 22a and a signal line 22s that are used for forming the microstrip line, and the first grounding electrode 22a may be electrically grounded. In order to clearly emphasize the main sprit of the present invention, only the patterns of the conductive layer 30 and the signal line 22s are illustrated in FIG. 9. The disposition of the first grounding electrode 22a and the signal line 22s are not limited, for example, to this embodiment, in which the first grounding electrode 22a is disposed at the top of the IC chip 20, and the signal line 22s is disposed at the bottom of the IC chip 20. The microstrip line is utilized for conveying microwave-frequency signals. And, a microwave component such as antenna, coupler, and the like may be formed from the microstrip line. In this embodiment, because the microstrip line or the electromagnetic coupling device 22 (such as microwave component) including the microstrip line partially overlaps the electromagnetic shielding layer 32, a balance performance between the isolation and the properties of the microstrip line or the electromagnetic coupling device 22 is obtained. Furthermore, the pattern of the electromagnetic shielding layer 32 of this embodiment may refer to the electromagnetic shielding layer 32 of any one of the embodiments described above.

Figure 11:
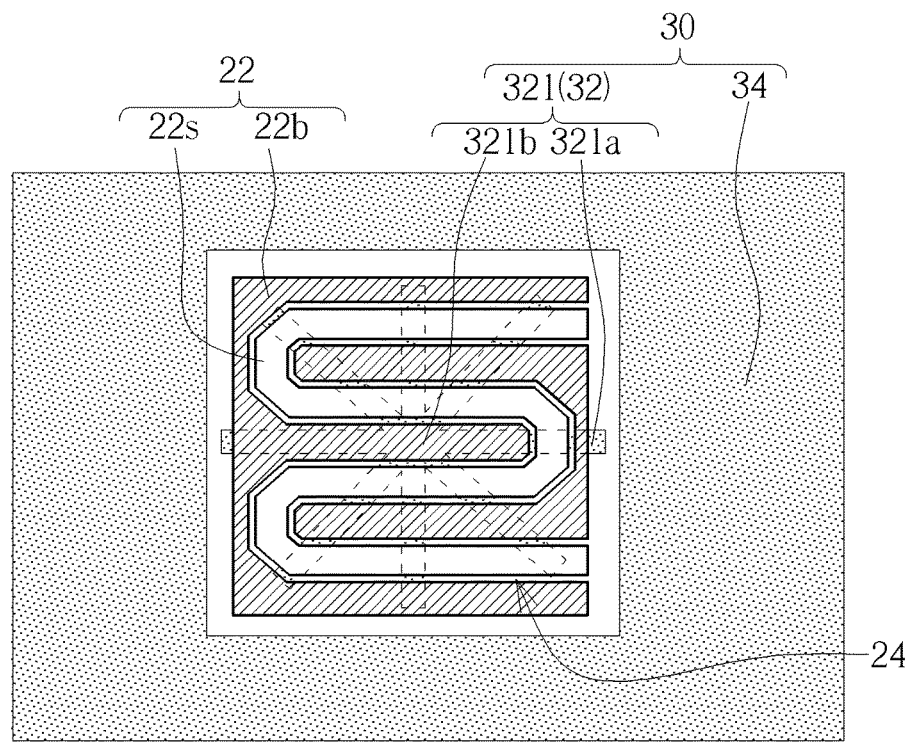
FIG. 11 is a schematic diagram of a top view of the conductive layer and the electromagnetic coupling device according to an eighth embodiment of the present invention.
Figure 12:
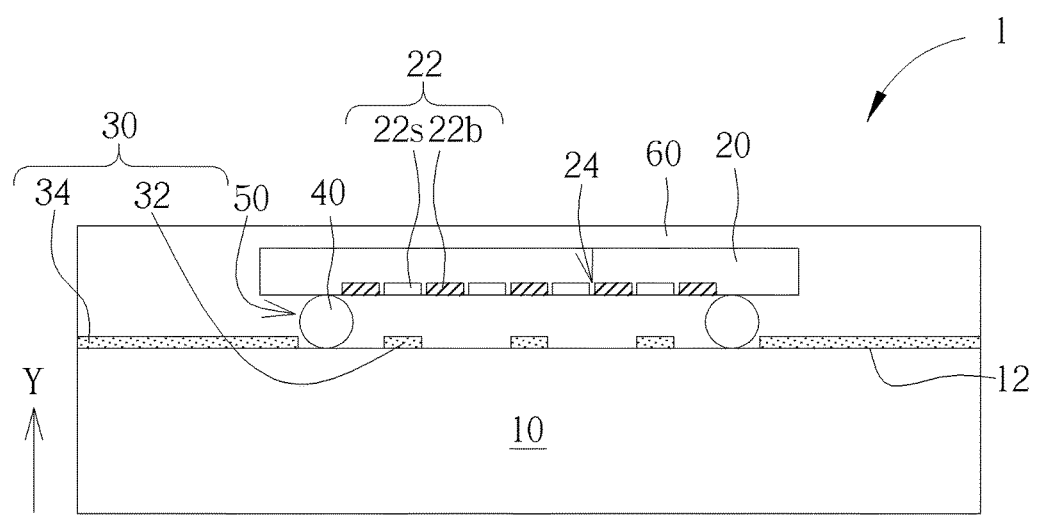
FIG. 12 is a schematic diagram of a cross-sectional view of the integrated circuit apparatus in FIG. 11.

Referring to FIG. 11 and FIG. 12, FIG. 11 is a schematic diagram of a top view of the conductive layer and the electromagnetic coupling device according to an eighth embodiment of the present invention, and FIG. 12 is a schematic diagram of a cross-sectional view of the integrated circuit apparatus in FIG. 11, wherein the electromagnetic coupling device 22 includes a transmission line for example in FIG. 11 and FIG. 12. The difference between this embodiment and the seventh embodiment is that the electromagnetic coupling device 22 includes a co-planar waveguide which is another type of the transmission line. In this embodiment, the electromagnetic coupling device 22 includes at least one second grounding electrode 22b and a signal line 22s which are used for forming as the co-planar waveguide, and the second grounding electrode 22b may be electrically grounded. The second grounding electrode 22b and the signal line 22s are disposed at the same side of the IC chip 20. For example, in this embodiment, the second grounding electrode 22b and the signal line 22s are disposed at the bottom of the IC chip 20, but not limited thereto. In the FIG. 11 and FIG. 12, the electromagnetic coupling device 22 has two second grounding electrodes 22b for example, and the signal line 22s is disposed between two of the second grounding electrodes 22b, that is to say, the signal line 22s is adjacent to two of the second grounding electrodes 22b closely. In addition, a space 24 exists between the signal line 22s and each of the second grounding electrodes 22b, so as to make the signal line 22s and the second grounding electrodes 22b be not electrically connected to each other directly. The co-planar waveguide is utilized for conveying microwave-frequency signals. In this embodiment, because the co-planar waveguide or the electromagnetic coupling device 22 including the co-planar waveguide partially overlaps the electromagnetic shielding layer 32, a balance performance between the isolation and the properties of the co-planar waveguide or the electromagnetic coupling device 22 is obtained. Furthermore, the pattern of the electromagnetic shielding layer 32 of this embodiment may refer to the electromagnetic shielding layer 32 of any one of the embodiments described above.

Figure 13:
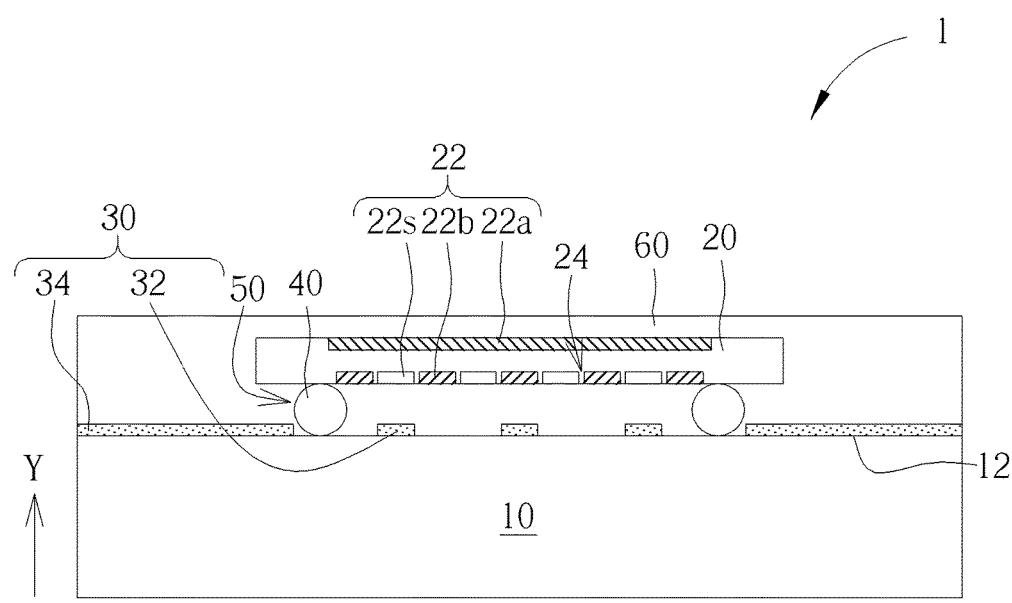
FIG. 13 is a schematic diagram of a cross-sectional view of an integrated circuit apparatus according to a ninth embodiment of the present invention.

Referring to FIG. 13, FIG. 13 is a schematic diagram of a cross-sectional view of an integrated circuit apparatus according to a ninth embodiment of the present invention, wherein the electromagnetic coupling device 22 includes a transmission line for example in FIG. 13. The difference between this embodiment and the seventh embodiment is that the electromagnetic coupling device 22 includes a grounded co-planar waveguide which is still another type of the transmission line. In this embodiment, the electromagnetic coupling device 22 includes a first grounding electrode 22a, one or more second grounding electrode 22b and a signal line 22s which are used for forming the co-planar waveguide. The first grounding electrode 22a and the second grounding electrode 22b may be electrically grounded, the second grounding electrode 22b and the signal line 22s are disposed at the same side of the IC chip 20, and the first grounding electrode 22a are disposed at the side of the IC chip 20 opposite to the signal line 22s. For example, in this embodiment, the first grounding electrode 22a is disposed at the top of the IC chip 20, and the second grounding electrode 22b and the signal line 22s are disposed at the bottom of the IC chip 20, but not limited thereto. In the FIG. 13, the electromagnetic coupling device 22 has two second grounding electrodes 22b for example, and the signal line 22s is disposed between two of the second grounding electrodes 22b, as shown in FIG. 11. Similarly, because the grounded co-planar waveguide or the electromagnetic coupling device 22 including the grounded co-planar waveguide partially overlaps the electromagnetic shielding layer 32, a balance performance between the isolation and the properties of the grounded co-planar waveguide or the electromagnetic coupling device 22 is obtained. Furthermore, the pattern of the electromagnetic shielding layer 32 of this embodiment may refer to the electromagnetic shielding layer 32 of any one of the embodiments described above.

In conclusion, the integrated circuit apparatus of the present invention utilizes the design of electromagnetic shielding layer for providing isolation of the electromagnetic coupling device to improve coupling issue. Specifically, the integrated circuit apparatus utilizes the specific pattern design of the electromagnetic shielding layer for improving the isolation and decreasing the degradation of properties of the electromagnetic coupling device simultaneously, wherein the electromagnetic shielding layer only partially overlaps the electromagnetic coupling device, as shown in FIG. 4 to FIG. 13, such that degradation of performance of the electromagnetic coupling device is not significant for that less parasitic capacitances is generated. Accordingly, a balance performance between the isolation and the properties of the electromagnetic coupling device is obtained without increasing the apparatus or chip area. Therefore, the integrated circuit apparatus of the present invention can be applied to the carrier aggregation techniques or long-term evolution (LTE) communication devices for providing good signal transmission performance.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An integrated circuit (IC) apparatus comprising:
a substrate;
an IC chip disposed above the substrate, the IC chip comprising an electromagnetic coupling device;
an electromagnetic shielding layer disposed on a surface of the substrate, wherein the electromagnetic shielding layer and the electromagnetic coupling device partially overlap in a vertical projection direction of the surface of the substrate; and
a grounding layer surrounding the electromagnetic shielding layer, wherein the grounding layer and the electromagnetic shielding layer belong to a same patterned layer.

2. The integrated circuit apparatus of claim 1, wherein the electromagnetic shielding layer has a closed-loop pattern.

3. The integrated circuit apparatus of claim 1, wherein the electromagnetic shielding layer has an opened-loop pattern.

4. The integrated circuit apparatus of claim 1, wherein the electromagnetic shielding layer is floating.

5. The integrated circuit apparatus of claim 1, wherein the electromagnetic shielding layer is grounded.

6. The integrated circuit apparatus of claim 1, wherein the electromagnetic shielding layer is connected to the grounding layer.

7. The integrated circuit apparatus of claim 1, wherein the electromagnetic shielding layer comprises a plurality of branches.

8. The integrated circuit apparatus of claim 1, wherein a material of the electromagnetic shielding layer comprises one of copper, nickel, palladium, gold and a combination thereof.

9. The integrated circuit apparatus of claim 1, wherein the electromagnetic coupling device comprises an inductor.

10. The integrated circuit apparatus of claim 1, wherein the electromagnetic coupling device comprises a coil.

11. The integrated circuit apparatus of claim 1, wherein the electromagnetic coupling device comprises a transmission line.

12. The integrated circuit apparatus of claim 11, wherein the transmission line comprises one of microstrip line, co-planar waveguide and grounded co-planar waveguide.

13. The integrated circuit apparatus of claim 1, wherein the electromagnetic shielding layer is disposed between the substrate and the IC chip.

14. The integrated circuit apparatus of claim 1, further comprising a gap situated between the electromagnetic shielding layer and the electromagnetic coupling device.

15. The integrated circuit apparatus of claim 14, further comprising an underfill in the gap between the electromagnetic shielding layer and the electromagnetic coupling device.

16. An integrated circuit (IC) apparatus comprising:
a substrate;
an IC chip disposed above the substrate, the IC chip comprising an electromagnetic coupling device; and
an electromagnetic shielding layer disposed on a surface of the substrate, wherein the electromagnetic shielding layer and the electromagnetic coupling device partially overlap in a vertical projection direction of the surface of the substrate;
wherein the electromagnetic shielding layer comprises a radial pattern with symmetry.

17. The integrated circuit apparatus of claim 16, wherein the radial pattern is a star-shaped pattern or a snowflake-shaped pattern.

18. The integrated circuit apparatus of claim 16, wherein the electromagnetic shielding layer has a closed-loop pattern.

19. The integrated circuit apparatus of claim 16, wherein the electromagnetic shielding layer has an opened-loop pattern.

20. The integrated circuit apparatus of claim 16, wherein the electromagnetic shielding layer is floating.

21. The integrated circuit apparatus of claim 16, wherein the electromagnetic shielding layer is grounded.

22. The integrated circuit apparatus of claim 16, wherein the electromagnetic shielding layer comprises a plurality of branches.

23. The integrated circuit apparatus of claim 16, wherein a material of the electromagnetic shielding layer comprises one of copper, nickel, palladium, gold and a combination thereof.

24. The integrated circuit apparatus of claim 16, wherein the electromagnetic coupling device comprises an inductor.

25. The integrated circuit apparatus of claim 16, wherein the electromagnetic coupling device comprises a coil.

26. The integrated circuit apparatus of claim 16, wherein the electromagnetic coupling device comprises a transmission line.

27. The integrated circuit apparatus of claim 26, wherein the transmission line comprises one of microstrip line, co-planar waveguide and grounded co-planar waveguide.

28. The integrated circuit apparatus of claim 16, wherein the electromagnetic shielding layer is disposed between the substrate and the IC chip.

29. The integrated circuit apparatus of claim 16, further comprising a gap situated between the electromagnetic shielding layer and the electromagnetic coupling device.

30. The integrated circuit apparatus of claim 29, further comprising an underfill in the gap between the electromagnetic shielding layer and the electromagnetic coupling device.

31. An integrated circuit (IC) apparatus comprising:
a substrate;
an IC chip disposed above the substrate, the IC chip comprising an electromagnetic coupling device; and
an electromagnetic shielding layer disposed on a surface of the substrate, wherein the electromagnetic shielding layer and the electromagnetic coupling device partially overlap in a vertical projection direction of the surface of the substrate;
wherein the electromagnetic shielding layer comprises a symmetric pattern and a frame pattern circling the symmetric pattern, and the frame pattern and the symmetric pattern are connected to each other through a branch of the symmetric pattern.

32. The integrated circuit apparatus of claim 31, wherein the electromagnetic shielding layer has a closed-loop pattern.

33. The integrated circuit apparatus of claim 31, wherein the electromagnetic shielding layer has an opened-loop pattern.

34. The integrated circuit apparatus of claim 31, wherein the electromagnetic shielding layer is floating.

35. The integrated circuit apparatus of claim 31, wherein the electromagnetic shielding layer is grounded.

36. The integrated circuit apparatus of claim 31, wherein the electromagnetic shielding layer comprises a plurality of branches.

37. The integrated circuit apparatus of claim 31, wherein a material of the electromagnetic shielding layer comprises one of copper, nickel, palladium, gold and a combination thereof.

38. The integrated circuit apparatus of claim 31, wherein the electromagnetic coupling device comprises an inductor.

39. The integrated circuit apparatus of claim 31, wherein the electromagnetic coupling device comprises a coil.

40. The integrated circuit apparatus of claim 31, wherein the electromagnetic coupling device comprises a transmission line.

41. The integrated circuit apparatus of claim 40, wherein the transmission line comprises one of microstrip line, co-planar waveguide and grounded co-planar waveguide.

42. The integrated circuit apparatus of claim 31, wherein the electromagnetic shielding layer is disposed between the substrate and the IC chip.

43. The integrated circuit apparatus of claim 31, further comprising a gap situated between the electromagnetic shielding layer and the electromagnetic coupling device.

44. The integrated circuit apparatus of claim 43, further comprising an underfill in the gap between the electromagnetic shielding layer and the electromagnetic coupling device.

* * * * *